US010263631B2

(12) United States Patent
Takemoto et al.

(10) Patent No.: US 10,263,631 B2
(45) Date of Patent: Apr. 16, 2019

(54) ANALOG DIGITAL CONVERTER

(71) Applicant: SANKEN ELECTRIC CO., LTD., Niiza-Shi, Saitama (JP)

(72) Inventors: Yoshitaka Takemoto, Niiza (JP); Hideki Hayashi, Ohme (JP)

(73) Assignee: SANKEN ELECTRIC CO., LTD., Niiza-shi (JP)

(*) Notice: Subject to any disclaimer, the term of this patent is extended or adjusted under 35 U.S.C. 154(b) by 0 days.

(21) Appl. No.: 15/903,090

(22) Filed: Feb. 23, 2018

(65) Prior Publication Data

US 2018/0248560 A1 Aug. 30, 2018

(30) Foreign Application Priority Data

Feb. 24, 2017 (JP) ................. 2017-032908

(51) Int. Cl.
*H03M 1/00* (2006.01)
*H03M 1/16* (2006.01)
*H03M 1/06* (2006.01)
*H03M 1/12* (2006.01)
*H03M 1/34* (2006.01)
*H03M 1/08* (2006.01)

(52) U.S. Cl.
CPC ......... *H03M 1/162* (2013.01); *H03M 1/0624* (2013.01); *H03M 1/0697* (2013.01); *H03M 1/08* (2013.01); *H03M 1/1255* (2013.01); *H03M 1/34* (2013.01)

(58) Field of Classification Search
CPC .... H03M 1/1215; H03M 1/12; H03M 1/0624; H03M 1/123; H03M 1/125; H03M 1/36; H03M 1/1245; H03M 1/468; H03M 1/144; H03M 1/00; H03M 1/44; H03M 1/1205
USPC ........ 341/155, 159, 161, 163, 172, 118–121, 341/137, 141, 142
See application file for complete search history.

(56) References Cited

U.S. PATENT DOCUMENTS 9,484,945 B1 * 11/2016 Wan .................. H03M 1/46
9,806,734 B1 * 10/2017 Madan ............... H03M 1/1245
(Continued)

FOREIGN PATENT DOCUMENTS

JP 2013-191976 A 9/2013

*Primary Examiner* — Linh V Nguyen
(74) *Attorney, Agent, or Firm* — Metrolexis Law Group, PLLC

(57) ABSTRACT

An analog to digital conversion device according to one or more embodiments may include sequential comparison type analog to digital converters, wherein each of the analog to digital converters converts an analog signal to a digital signal by repeating comparative voltage generation processing to generate a comparative voltage and comparison processing to compare the analog signal with the comparative voltage. Each of the analog to digital converters may include a noise notification part that generates a noise notification signal to give notification of noise production and inputs the noise notification signal to a different one of the analog to digital converters. At start of operation, based on the notification noise signal inputted from the different analog to digital converter, each of the analog to digital converters may be synchronized with the different analog to digital converter performing the comparative voltage generation processing and the comparison processing.

5 Claims, 3 Drawing Sheets

(56) References Cited

U.S. PATENT DOCUMENTS

| | | | |
|---|---|---|---|
| 2004/0155806 A1* | 8/2004 | Lee | H03M 1/0624 |
| | | | 341/155 |
| 2005/0024251 A1* | 2/2005 | Harada | H03M 1/1225 |
| | | | 341/163 |
| 2006/0290556 A1* | 12/2006 | Sherry | H03M 1/0624 |
| | | | 341/156 |
| 2010/0039305 A1* | 2/2010 | Yoshioka | H03K 3/356121 |
| | | | 341/155 |
| 2015/0042500 A1* | 2/2015 | Fujiwara | H03M 1/46 |
| | | | 341/155 |
| 2016/0079994 A1* | 3/2016 | Lee | H03M 1/002 |
| | | | 341/118 |
| 2017/0093417 A1* | 3/2017 | Iwashita | G06F 13/4247 |

* cited by examiner

ANALOG DIGITAL CONVERTER

CROSS REFERENCE TO RELATED APPLICATIONS

This application claims priority based on 35 USC 119 from prior Japanese Patent Application No. 2017-32908 filed on Feb. 24, 2017, entitled "ANALOG DIGITAL CONVERTER", the entire contents of which are incorporated herein by reference.

BACKGROUND

A sequential conversion type analog to digital (AD) converter holds an input analog signal, and performs comparison processing to compare the held analog signal with a comparative voltage repetitively for every bit to thereby obtain a digital signal as a conversion result (see, for example, Japanese Patent Application Publication No. 2013-191976 (Patent Literature 1)). In the comparison processing, a comparative voltage for the next bit comparison needs to be generated using a digital to analog (DA) converter, and noise may be produced in the generation of the comparative voltage. In an approach proposing improvement in conversion accuracy, the comparison processing for the next bit is performed not immediately after the comparison processing for the previous bit, but after noise produced during the generation of the comparative voltage settles down (e.g., after waiting one clock).

However, when an AD conversion device includes a plurality of sequential conversion type AD converters that operate independently of one another, noise produced in a certain sequential conversion type AD converter affects the comparison processing performed by another AD converter. This poses a problem of degradation in the conversion accuracy. If the sequential conversion type AD converters are synchronized, noise can be controlled not to be produced in the comparison processing. This, however, puts load on a higher-level device which needs to control the synchronization of the AD converters.

SUMMARY

An analog to digital conversion device according to one or more embodiments may include sequential comparison type analog to digital converters, wherein each of the analog to digital converters converts an analog signal to a digital signal by repeating comparative voltage generation processing to generate a comparative voltage and comparison processing to compare the analog signal with the comparative voltage. Each of the analog to digital converters may include a noise notification part that generates a noise notification signal to give notification of noise production and inputs the noise notification signal to a different one of the analog to digital converters. At start of operation, based on the notification noise signal inputted from the different analog to digital converter, each of the analog to digital converters may be synchronized with the different analog to digital converter performing the comparative voltage generation processing and the comparison processing.

An analog to digital conversion device according to one or more embodiments may include a first analog to digital converter and a second analog to digital converter, each including: a controller that generates a first processing clock, a second processing clock, and a third processing clock based on a reference clock signal and an enable signal; a sample and hold circuit that receives an analog signal and holds a signal level of the analog signal based on the enable signal; a comparator that receives the held signal level of the analog signal and a comparative voltage and compares the signal level with the comparative voltage based on the second processing clock; a sequential comparison register that stores a digital value corresponding to a comparison result obtained by the comparator based on the third processing clock and outputs a given digital signal; and a digital to analog converter that receives the first processing clock, and based on the first processing clock, generates the comparative voltage corresponding to the digital value stored in the sequential comparison register. The controller of the first analog to digital converter may generate a noise notification signal that gives notification of noise production, and the controller of the second analog to digital converter may control the first processing clock, the second processing clock, and the third processing clock based on the noise notification signal generated by the first analog to digital converter, and thereby synchronizes the second analog to digital converter with the first analog to digital converter.

DETAILED DESCRIPTION

Figure 1:
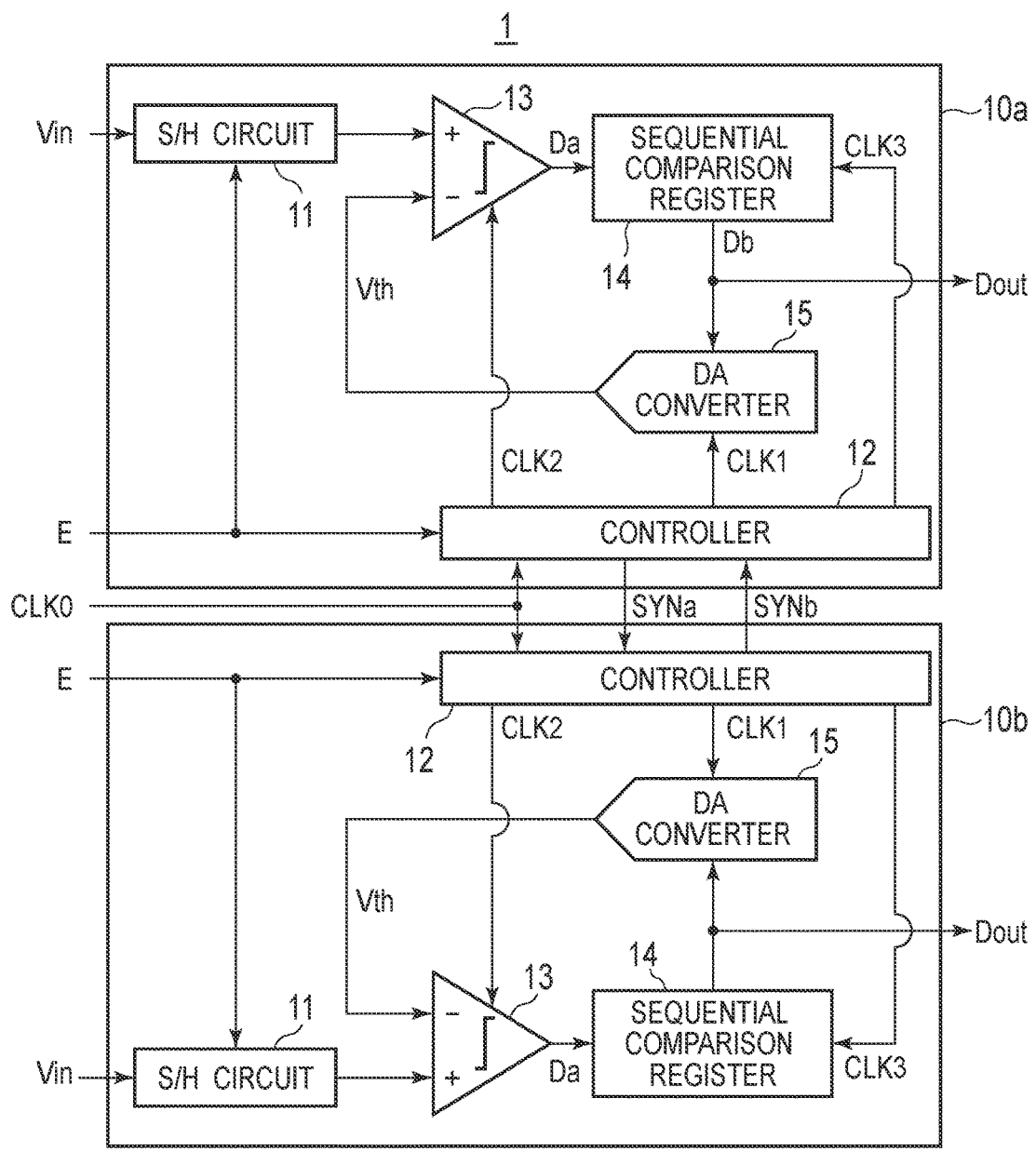
FIG. 1 is a diagram illustrating the circuitry configuration of an AD conversion device according to one or more embodiments.

Embodiments are explained with referring to drawings. In the respective drawings referenced herein, the same constituents are designated by the same reference numerals and duplicate explanation concerning the same constituents is basically omitted. All of the drawings are provided to illustrate the respective examples only. No dimensional proportions in the drawings shall impose a restriction on the embodiments. For this reason, specific dimensions and the like should be interpreted with the following descriptions taken into consideration. In addition, the drawings include parts whose dimensional relationship and ratios are different from one drawing to another.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

FIG. 1 is a circuitry configuration diagram of an AD conversion device 1 according to one or more embodiments. Referring to FIG. 1, the AD conversion device 1 includes two AD converters: an AD converter 10a and an AD converter 10b. The AD converter 10a and the AD converter 10b may have the same configuration or different configurations.

The AD converter 10a, 10b is a sequential comparison type AD converter that converts an input analog signal Vin to a digital signal Dout having a plurality of bits. The AD converter 10a, 10b may include a sample and hold (S/H) circuit 11, a controller 12, a comparator 13, a sequential comparison register 14, and a digital to analog (DA) converter 15.

Based on an enable signal E inputted from a higher-level device, the S/H circuit 11 samples and holds an analog signal Vin to be subjected to AD conversion, once per one conversion.

Based on a reference clock signal CLK0 and the enable signal E inputted from the higher-level device, the controller 12 generates a first processing clock CLK1 that controls the DA converter 15, a noise notification signal SYN that gives notification of noise production timing, a second processing clock CLK2 that controls the comparator 13, and a third processing clock CLK3 that controls the sequential comparison register 14.

The noise notification signal SYN generated by the controller 12 is a signal for notifying the other AD converter 10a, 10b of the timing of noise production caused by the AD converter itself. Thus, in this embodiment, the noise notification signal SYN generated by the controller 12 of the AD converter 10a is inputted to the controller 12 of the AD converter 10b, and the noise notification signal SYN generated by the controller 12 of the AD converter 10b is inputted to the controller 12 of the AD converter 10a.

Based on the second processing clock CLK2, the comparator 13 compares, for every bit, the analog signal Vin held by the S/H circuit 11 with a comparative voltage Vth generated by the DA converter 15, and outputs the comparison result to the sequential comparison register 14.

Based on the third processing clock CLK3, the sequential comparison register 14 stores, for every bit, a digital value corresponding to the comparison result outputted from the comparator 13, and after the comparison is done for all the bits, outputs a digital signal Dout as a conversion result.

Based on the first processing clock CLK1, the DA converter 15 generates a comparative voltage Vth corresponding to the digital value stored in the sequential comparison register 14.

Figure 2:
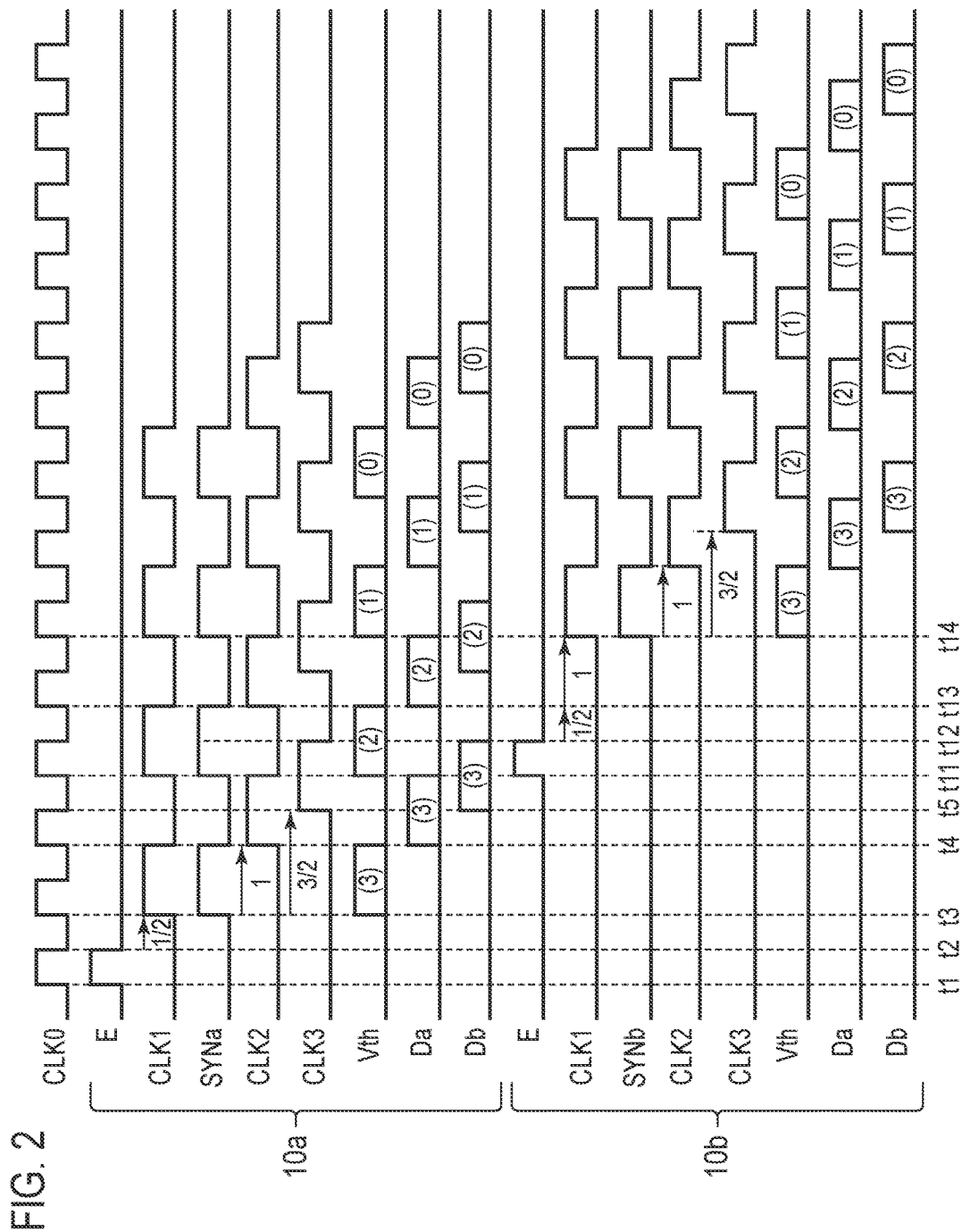
FIG. 2 is a waveform diagram illustrating the operation of the AD conversion device illustrated in FIG. 1.
Figure 3:
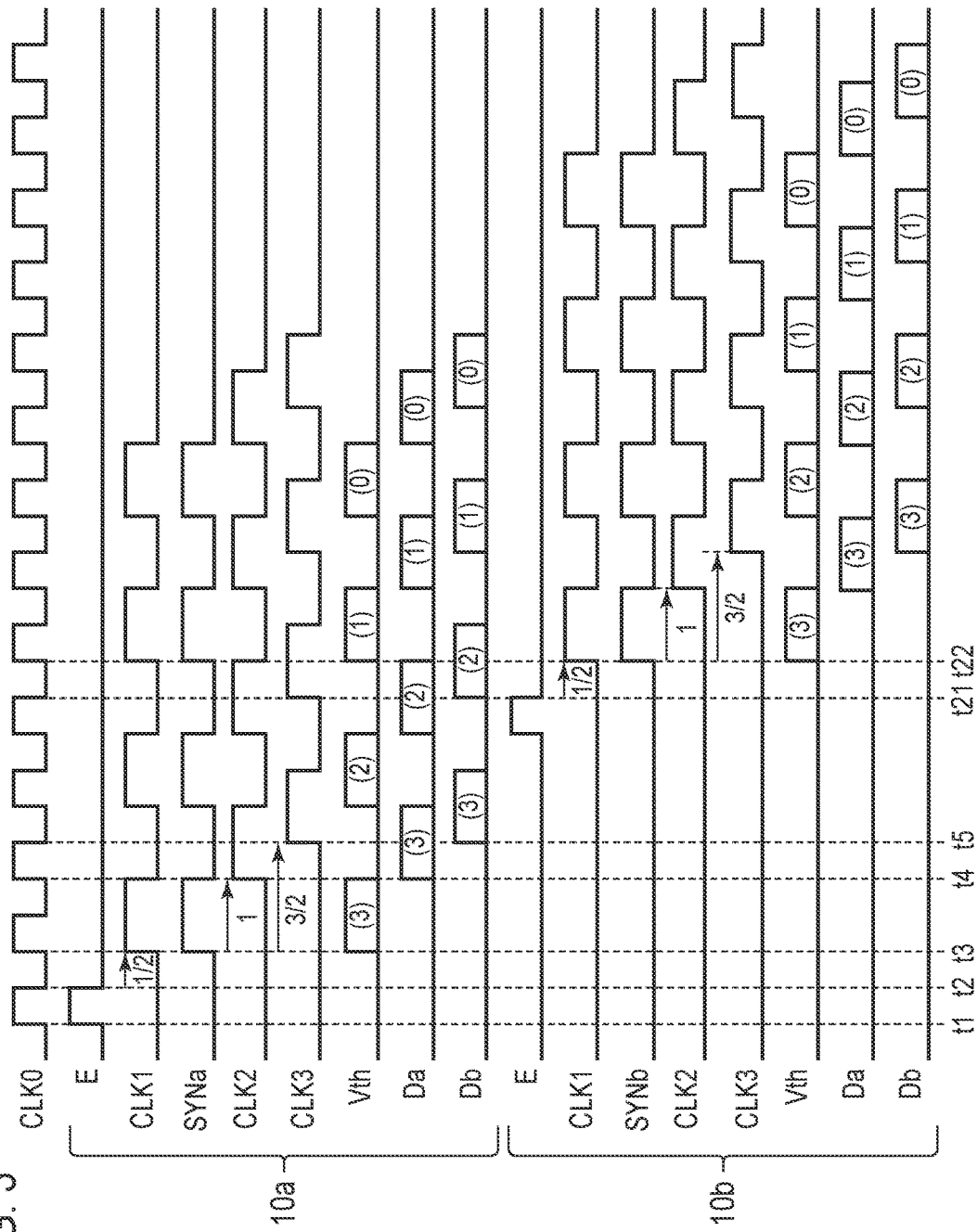
FIG. 3 is a waveform diagram illustrating the operation of the AD conversion device illustrated in FIG. 1.

Next, the operation of the AD conversion device 1 is described in detail with reference to FIGS. 2 and 3. Note that FIGS. 2 and 3 illustrate an example where the AD converter 10b starts to operate while the AD converter 10a is operating. In FIGS. 2 and 3, the operation of the AD converter 10a is the same, but the timings at which the AD converter 10b starts to operate are different. Although FIGS. 2 and 3 illustrate a case where an analog signal is converted to a four bit long digital signal for simplification, the number of bits in the AD conversion is not limited to four bits.

First, the operation of the AD converter 10a is described. The S/H circuit 11 samples the analog signal Vin when the enable signal E inputted to the AD converter 10a rises at time t1, and holds the analog signal Vin when the enable signal E falls at time t2. Note that the rise and fall of the enable signal E are synchronous with the rise and fall of the reference clock signal CLK0, respectively.

Meanwhile, when the enable signal E falls at time t2, the controller 12 checks the output level of the noise notification signal SYN outputted from the controller 12 of the AD converter 10b (hereinafter referred to as a noise notification signal SYNb). Since the AD converter 10b has not started to operate yet at this point, the output level of the noise notification signal SYNb is Low.

The noise notification signal SYNb is a signal that gives notification of whether the AD converter 10b is currently causing and producing noise, and gives notification of noise production timing by setting its output level to High. Thus, when the output level of the noise notification signal SYNb is Low, it means that the AD converter 10b is not performing the noise-producing operation of generating the comparative voltage Vth.

Then, the controller 12 starts generating the first processing clock CLK1 which rises in synchronous with the next rise of the reference clock signal CLK0 (time t3) and has a cycle twice as long as the reference clock signal CLK0. The first processing clock CLK1 is a signal for instructing, at its rise, the DA converter 15 to generate the comparative voltage Vth, and is generated as many as the bits for the AD conversion. The controller 12 also generates, based on the first processing clock CLK1, the noise notification signal SYN (hereinafter referred to as a noise notification signal SYNa) in synchronous with the first processing clock CLK1, the second processing clock CLK2 which is delayed from the first processing clock CLK1 by one cycle of the reference clock signal CLK0, and the third processing clock CLK3 which is delayed from the first processing clock CLK1 by 3/2 cycle of the reference clock signal CLK0.

When the first processing clock CLK1 rises at time t3, the DA converter 15 generates a comparative voltage Vth (3). Note that the comparative voltage Vth (3) is set to a half of the full scale of the analog signal Vin.

Next, when the second processing clock CLK2 rises at time t4, the comparator 13 determines a Da (3) as the most significant bit, the Da (3) being a result of comparison between the analog signal Vin held by the S/H circuit 11 and the comparative voltage Vth (3) generated by the DA converter 15.

Next, when the third processing clock CLK3 rises at time t5, the Da (3) is stored in the sequential comparison register 14 as a Db (3). Based on this Db (3) stored in the sequential comparison register 14, the DA converter 15 generates, at the next rise of the first processing clock CLK1, a comparative voltage Vth (2) to be used for the next comparison. This operation is repeated thereafter to perform the comparison for all the bits, and once the last bit is stored in the sequential comparison register 14, all the bits are outputted as a digital signal Dout.

As described, the second processing clock CLK2 that determines the comparison result obtained by the comparator 13 is shifted from the first processing clock CLK1 that instructs the DA converter 15 to generate the comparative voltage Vth by one cycle of the reference clock signal CLK0. In other words, the generation of the comparative voltage Vth by the DA converter 15 and the comparison by the comparator 13 are performed alternately for each cycle of the reference clock signal CLK0.

Next, the operation of the AD converter 10b is described. The S/H circuit 11 samples the analog signal Vin when the enable signal E inputted to the AD converter 10b rises at time t11, and holds the analog signal Vin when the enable signal E falls at time t12.

Meanwhile, when the enable signal E falls at time t12, the controller 12 checks the output level of the noise notification signal SYNa. The output level of the noise notification signal SYNa at this point is High.

The noise notification signal SYNa is a signal that gives notification of whether the AD converter 10a is currently causing and producing noise, and gives notification of noise production timing by setting its output level to High. Thus, when the output level of the noise notification signal SYNa is High, the AD converter 10a is performing the noise-producing operation of generating the comparative voltage Vth. This means that the comparator 13 performs the comparison processing at the next rise of the reference clock signal CLK0 (time t13).

Thus, the controller 12 starts generating the first processing clock CLK1 not at the next rise of the reference clock signal CLK0 (time t13), but at time t14 which is delayed from time t13 by one cycle of the reference clock signal CLK0.

This causes the AD converter 10a and the AD converter 10b to be synchronized and prevents the processing to generate the comparative voltage Vth and the comparison processing from being performed at the same timing by the AD converter 10a and the AD converter 10b. Thus, even if a plurality of sequential conversion type AD converters operate independently of each other, degradation in the conversion accuracy due to noise can be mitigated. Note that the present embodiment is configured so that the generation of the comparative voltage Vth by the DA converter 15 and the comparison by the comparator 13 are performed alternately for each cycle of the reference clock signal CLK0. Thus, control of the timing to start generating the first processing clock CLK1 ensures automatic synchronization thereafter.

In the example illustrated in FIG. 3, at the timing of the fall of the enable signal E inputted to the AD converter 10b (time t21), the output level of the noise notification signal SYNa is Low. When the output level of the noise notification signal SYNa is Low, it means that the AD converter 10a is not performing the noise-producing operation of generating the comparative voltage Vth, and that the DA converter 15 performs the operation of generating the comparative voltage Vth at the next rise of the reference clock signal CLK0 (time t22).

Thus, the controller 12, like that of the above-described AD converter 10a, starts generating the first processing clock CLK1 at the next rise of the reference clock signal CLK0 (time t22). This causes the AD converter 10a and the AD converter 10b to be synchronized.

Although there are two AD converters in the example described in the present embodiment, a similar approach can be used for a case of three or more AD converters by inputting the noise notification signal SYN to all the other AD converters.

Further, if the time for waiting for noise to settle down, i.e., the interval of performing comparison processing, is not one clock, the AD converters can be synchronized by input of a noise notification signal SYN containing a numerical value indicative of a noise production period to the other AD converters and making the interval of performing the comparison processing the same among the AD converters.

As described above, the AD conversion device 1 according to an embodiment includes the sequential comparison type AD converters 10a, 10b each of which converts an analog signal to a digital signal by repeating comparative voltage generation processing to generate a comparative voltage and comparison processing to compare the analog signal with the comparative voltage. The AD converters 10a, 10b each include the controller 12 (the noise notification p) that generates the noise notification signal SYN to give notification of noise production and inputs the noise notification signal SYN to the other AD converter 10b, 10a. At the start of operation, based on the noise notification signal SYN inputted from the other AD converter 10b, 10a, the AD converter 10a, 10b is synchronized with the other AD converter 10b, 10a performing the comparative voltage generation processing and the comparison processing. Thus, even if the AD converters 10a, 10b operate independently of each other, the operations of the AD converters 10a, 10b can be synchronized based on the noise notification signal SYN. This can prevent the comparative voltage generation processing and the comparison processing from being performed at the same time, and therefore mitigate degradation in the conversion accuracy due to noise.

Further, in the present embodiment, the AD converter 10a, 10b repeats the comparative voltage generation processing and the comparison processing for every circle of the reference clock signal CLK0, and if notified of noise production with the noise notification signal SYN at the start of operation, delays the start of the operation by one cycle of the reference clock signal CLK0. With such a configuration, the operations of the AD converters 10a, 10b can be synchronized easily only by the delaying of the start of the operation by one cycle of the reference clock signal CLK0.

Although the invention has been described using embodiments, the embodiments is merely an example. The invention can be changed and implemented without departing from the gist of the invention.

As thus described, according to one or more embodiments, even if a plurality of AD converters are operated independently of one another, the operations of the AD converters can be synchronized based on a noise notification signal. This can prevent the comparative voltage generation processing and the comparison processing from being performed at the same time, and therefore mitigate degradation in the conversion accuracy due to noise.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. An analog to digital conversion device comprising sequential comparison type analog to digital converters, wherein each of the analog to digital converters converts an analog signal to a digital signal by repeating comparative voltage generation processing to generate a comparative voltage and comparison processing to compare the analog signal with the comparative voltage, wherein
    each of the analog to digital converters comprises a noise notification part that generates a noise notification signal to give notification of noise production during the comparative voltage generation processing and inputs the noise notification signal to a different one of the analog to digital converters, wherein
    at start of operation, based on the notification noise signal inputted from the different analog to digital converter, each of the analog to digital converters is synchronized with the different analog to digital converter performing the comparative voltage generation processing and the comparison processing.

2. The analog to digital conversion device according to claim 1, wherein
    each of the analog to digital converters repeats the comparative voltage generation processing and the comparison processing for every cycle of a reference clock, and
    if noise production has been notified of with the noise notification signal at start of operation, the analog to digital converter delays the start of the operation by one cycle of the reference clock.

3. An analog to digital conversion device comprising:
    a first analog to digital converter and a second analog to digital converter, each comprising:

a controller that generates a first processing clock, a second processing clock, and a third processing clock based on a reference clock signal and an enable signal;
a sample and hold circuit that receives an analog signal and holds a signal level of the analog signal based on the enable signal;
a comparator that receives the held signal level of the analog signal and a comparative voltage and compares the signal level with the comparative voltage based on the second processing clock;
a sequential comparison register that stores a digital value corresponding to a comparison result obtained by the comparator based on the third processing clock and outputs a given digital signal; and
a digital to analog converter that receives the first processing clock, and based on the first processing clock, generates the comparative voltage corresponding to the digital value stored in the sequential comparison register, wherein
the controller of the first analog to digital converter generates a noise notification signal that gives notification of noise production, and
the controller of the second analog to digital converter controls the first processing clock, the second processing clock, and the third processing clock based on the noise notification signal generated by the first analog to digital converter, and thereby synchronizes the second analog to digital converter with the first analog to digital converter.

4. The analog to digital converter according to claim 3, wherein
the controller of the first analog to digital converter generates the noise notification signal of a first level when the digital to analog converter is not generating the comparative voltage, and generates the noise notification signal of a second level when the digital to analog converter is generating the comparative voltage.

5. The analog to digital converter according to claim 4, wherein
the controller of the second analog to digital converter delays the generation of the first processing clock when the noise notification signal generated by the controller of the first analog to digital converter is of the second level.

* * * * *